United States Patent
Azuma

(10) Patent No.: US 6,279,502 B1
(45) Date of Patent: Aug. 28, 2001

(54) RESIST DEVELOPING METHOD BY MAGNETIC FIELD CONTROLLING, RESIST DEVELOPING APPARATUS AND METHOD OF FABRICATING SEMICONDUCTOR DEVICE

(75) Inventor: Tsukasa Azuma, Tokyo (JP)

(73) Assignee: Kabushiki Kaisha Toshiba, Kawasaki (JP)

(*) Notice: Subject to any disclaimer, the term of this patent is extended or adjusted under 35 U.S.C. 154(b) by 0 days.

(21) Appl. No.: 09/182,631

(22) Filed: Oct. 30, 1998

Related U.S. Application Data

(62) Division of application No. 08/951,169, filed on Oct. 15, 1997, now Pat. No. 5,866,303.

(51) Int. Cl.[7] .............................. B05C 11/02; B05C 11/08; B01J 19/12; C25D 13/06
(52) U.S. Cl. ........................ 118/663; 118/621; 118/320; 118/623; 118/629; 118/56; 427/457; 427/472; 430/825; 204/622; 204/DIG. 5; 205/87
(58) Field of Search .................................. 118/302, 319, 118/320, 621, 623, 625, 629, 663, 56; 427/457, 458, 472, 485, 486; 156/272.2, 272.4, 379.6, 379.7; 204/622, DIG. 5; 430/311, 322, 325, 331; 205/89

(56) References Cited

U.S. PATENT DOCUMENTS

| | | |
|---|---|---|
| 3,207,684 | 9/1965 | Dotts, Jr. . |
| 3,522,162 | 7/1970 | Davies . |
| 3,567,611 | 3/1971 | Michel et al. . |
| 3,666,648 | 5/1972 | Lasky et al. ..................... 204/180 R |
| 3,984,298 | 10/1976 | Haber ................................ 204/180 S |
| 4,013,462 | 3/1977 | Goffe et al. ........................... 96/1 PS |
| 4,130,761 | 12/1978 | Matsuda ............................ 250/492 A |
| 4,911,806 | 3/1990 | Hofmann .......................... 204/180.1 |
| 4,983,253 | 1/1991 | Wolfe et al. ......................... 156/643 |
| 5,133,844 * | 7/1992 | Stevens .............................. 204/180.1 |
| 5,215,619 | 6/1993 | Cheng et al. ......................... 156/345 |
| 5,225,024 | 7/1993 | Hanley et al. ....................... 156/345 |
| 5,266,154 | 11/1993 | Tatsumi ............................... 156/643 |
| 5,312,778 | 5/1994 | Collins et al. ....................... 437/225 |
| 5,346,579 | 9/1994 | Cook et al. .......................... 156/345 |
| 5,421,891 | 6/1995 | Campbell et al. ............... 118/723 R |
| 5,474,877 | 12/1995 | Suzuki ................................ 430/325 |
| 5,534,108 | 7/1996 | Qian et al. ........................ 156/343.1 |
| 5,556,501 | 9/1996 | Collins et al. ....................... 153/345 |
| 5,916,366 * | 6/1999 | Ueyama et al. ....................... 118/52 |

* cited by examiner

Primary Examiner—Richard Crispino
Assistant Examiner—J. A. Lorengo
(74) Attorney, Agent, or Firm—Banner & Witcoff, Ltd.

(57) ABSTRACT

A semiconductor device is fabricated by the steps of coating an underlayer formed on a semiconductor substrate with chemically amplified resist, exposing the resist to light, bringing the resist into contact with an alkaline developing solution with applying a magnetic field to the alkaline developing solution for conducting development to form a resist pattern, and etching the underlayer on the semiconductor substrate using the resist pattern as a mask.

1 Claim, 3 Drawing Sheets

RESIST DEVELOPING METHOD BY MAGNETIC FIELD CONTROLLING, RESIST DEVELOPING APPARATUS AND METHOD OF FABRICATING SEMICONDUCTOR DEVICE

The present application is a divisional of Ser. No. 08/951,169, filed Oct. 15, 1997, now U.S. Pat. No. 5,866,303.

BACKGROUND OF THE INVENTION

The present invention relates to a resist developing method by magnetic field controlling, a resist developing apparatus and a method of fabricating a semiconductor device.

For manufacturing a semiconductor device of the next generation, for example, 1-Gbit DRAM, it is aimed to use a ground rule of 0.15 μm or less of a circuit pattern formed via resist coating, exposure, development and etching. For increasing the yield of semiconductor chips and improving the productivity, it is required that the pattern size is uniform in whole surface of a semiconductor wafer. Further, uniformity of the pattern size is required to be more excellent than that obtained by the present technique. Concretely, tolerance in error of a fabricated pattern size with respect to the designed size is more severely restricted to ±5%, which is ±10% in the present condition. To meet such requirements become more difficult with enlargement of the size of a semiconductor wafer from 8 inch to 12 inch.

For satisfying the above-described requirements, it is investigated to change KrF excimer laser having a wavelength of 248 nm used in a present exposure system to ArF excimer laser having a wavelength of 193 nm. However, the change of a light source requires improvement of the entire exposure system including a resist. Therefore, it is necessary to improve lithography process to satisfy the above-described requirement using the present exposure system.

In an advanced resist process, there is adopted a method in which a chemically amplified positive resist containing an acid generator is used and development is conducted using an alkaline developing solution, for example, an aqueous tetramethylammonium hydroxide (TMAH) solution. Concretely, a resist is applied to a semiconductor wafer and exposed to light by which an acid generates from an acid generator in the resist. By the action of the generated acid, a substituent having dissolution inhibiting ability, for example, a t-butyl ester group, is released from a resist resin and the resin becomes soluble in an alkali solution (a). On the other hand, TMAH in a developing solution is dissociated into $N(CH_3)_4^+$ ion and $OH^-$ ion (b). Then, development progresses by the neutralization reaction of a cation in the developing solution with the resist component which has become alkali-soluble. This reaction model is represented by the following formula.

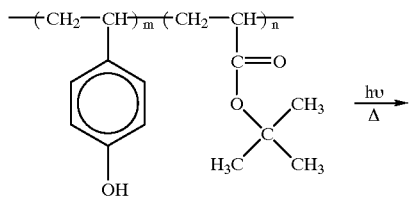

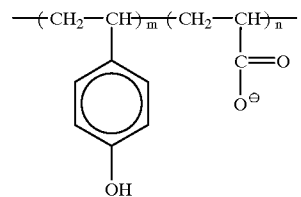

(a)

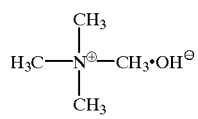

(b)

The ions in the developing solution are transported by diffusion and convection and reach the reaction site of the resist to carry out development. However, by the reaction of an alkali in the developing solution with the alkali-soluble component in the resist, a neutral reaction products are produced, and these reaction products prevent another ions from reaching the reaction site of the resist. Therefore, depending on the position in the semiconductor wafer surface, there is a possibility that the above-described neutralization reaction does not progress sufficiently. As a result, uniformity of a resist pattern is lost in the semiconductor wafer surface.

BRIEF SUMMARY OF THE INVENTION

The object of the present invention is to improve uniformity of the developed resist profile in the semiconductor wafer surface.

The resist developing method of the present invention comprises steps of: coating an article to be treated with a chemically amplified resist; exposing the resist to light; and bringing the resist into contact with an alkaline developing solution for conducting development with applying a magnetic field to the alkaline developing solution.

The resist developing apparatus of the present invention comprises a rotating axis for pivotally supporting a semiconductor wafer coated with a chemically amplified resist, a nozzle for supplying an alkaline developing solution to the resist, and a means for applying a magnetic field to the alkaline developing solution on the resist.

The method of fabricating a semiconductor device of the present invention comprises steps of: coating an underlayer formed on a semiconductor substrate with a chemically amplified resist; exposing the resist to light; and bringing the resist into contact with an alkaline developing solution with applying a magnetic field to the alkaline developing solution for conducting development to form a resist pattern; and etching the underlayer using the resist pattern as a mask.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Figure 1:
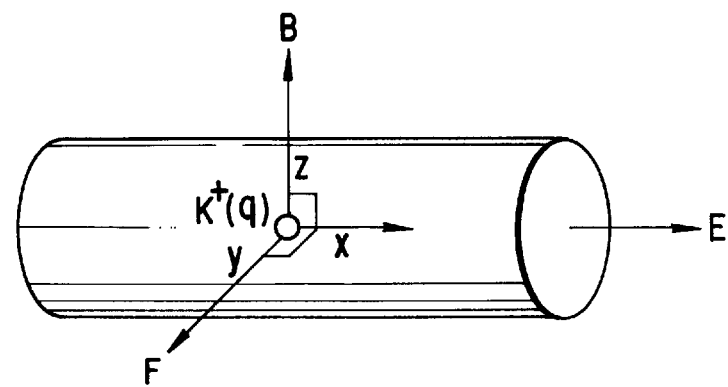
FIG. 1 shows Lorentz force acting on an ion in a developing solution.

The principle of the present invention will be described below. For progressing development of a chemically amplified resist by an alkaline developing solution, it is effective to promote motions of ions in the developing solution to make it easy for the ions to reach the reaction site of the resist. In the present invention, a magnetic field is applied to the developing solution for imparting Lorentz force to the ions in the developing solution to promote their motions. This mechanism is described referring to FIG. 1. When a cation $K^+$ in the developing solution diffuses along x direction, an electric field is formed. In this condition, when a magnetic field is applied to z direction, the cation $K^+$ in the developing solution receives Lorentz force represented by the following equation:

$$F=q(E+vB)$$

wherein, F is Lorentz force, q is electric charge, E is electric field, v is speed of a particle, and B is magnetic flux density. Therefore, the cation $K^+$ moves along y direction. By forcefully moving the cation $K^+$ by imparting Lorenz force as described above, the cation can easily reach the reaction site of the resist and development can be progressed uniformly. Therefore, uniformity of developed resist profile in the surface can be improved.

In the present invention, a chemically amplified resist is applied to an article to be treated, for example, a semiconductor substrate, and exposed to light, then, the article is placed on a developing apparatus equipped with a magnetic field generating means. The magnetic field generating means may be a permanent magnet or electromagnet, and it is preferable to change the direction and strength of a magnetic field using an electromagnet.

The embodiments of the present invention will be described below referring to drawings.

Figure 2:
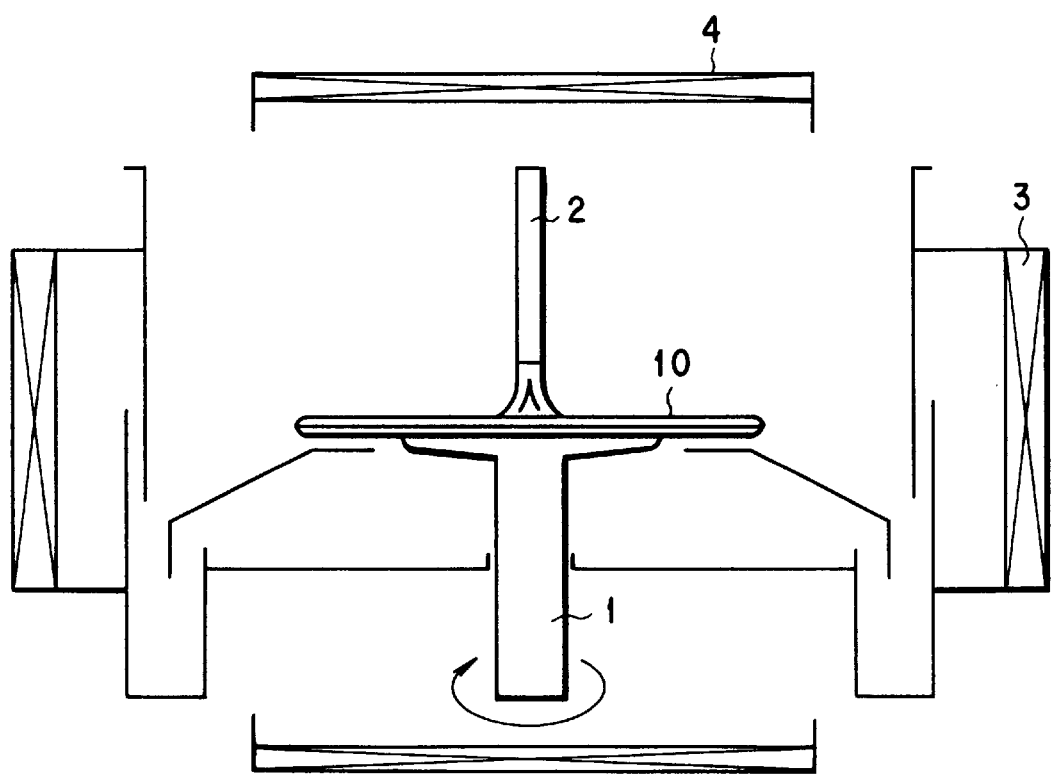
FIG. 2 shows the developing apparatus of the present invention.
Figure 3A:
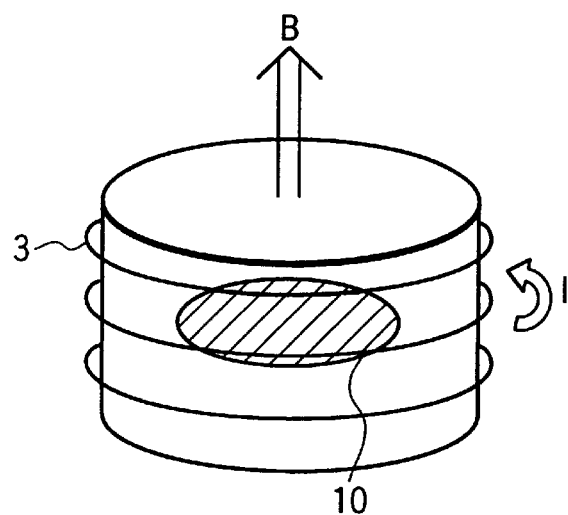
FIGS. 3A to 3C show the direction of a magnetic field applied to a developing solution.
Figure 3B:
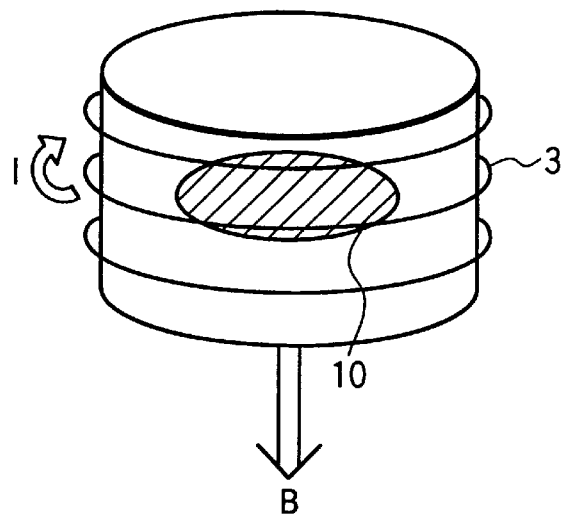
Figure 3C:
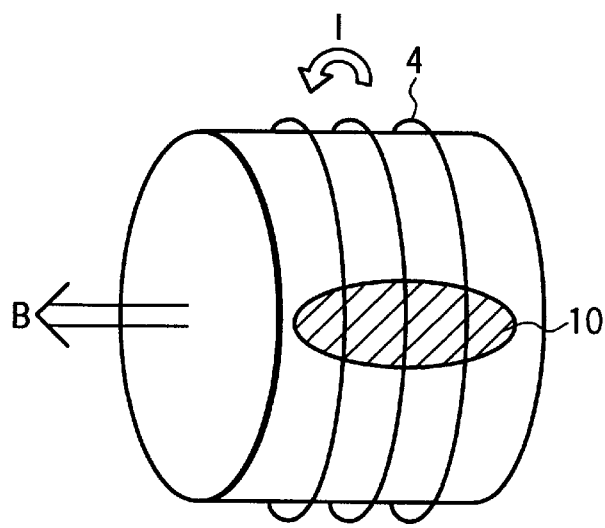

FIG. 2 shows a developing apparatus according to the present invention. A semiconductor wafer 10 which has been subjected to the exposure step of a resist is held by a vacuum chuck on the rotating axis 1 of the developing apparatus. A developing solution is dropped on a semiconductor wafer 10 from a nozzle 2. Around the developing apparatus, a coil 3 for applying a magnetic field in the vertical direction and a coil 4 for applying a magnetic field in the horizontal direction are disposed. The magnetic flux density is set, for example, at 120 gauss, and may be changed in the range from 100 to 200 gauss. Further, as shown in FIGS. 3A to 3C, the direction of a magnetic field can be changed optionally by changing the direction of electric current and a coil used.

Next, a method for patterning a silicon oxide film formed on a silicon substrate.

Figure 4A:
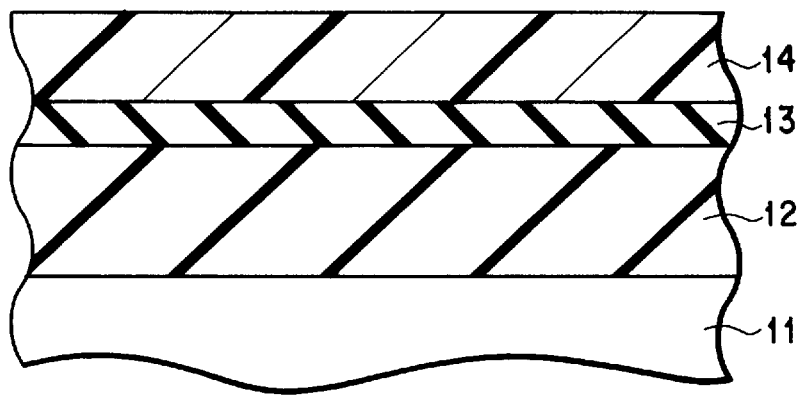
FIGS. 4A to 4C show a method for patterning an oxide film on a silicon substrate by the present invention.

As shown in FIG. 4A, an $SiO_2$ film 12 is formed on the surface of an 8-inch Si wafer 11. An anti-reflective coating 13 (manufactured by Shipley, trade name: BARL) is spin-coated at a thickness of 90 nm on the $SiO_2$ film 12, and then baked for 60 seconds at 225° C. A chemically amplified positive resist 14 (manufactured by Shipley, trade name: APEX-E) is spin-coated at a thickness of 600 nm on the anti-reflective coating 13, and then baked for 60 seconds at 90° C.

The resist is exposed using a KrF excimer laser aligner (manufactured by Nikon, S201A)[NA=0.6,σ=0.75, wavelength:248 nm], and 0.25 μm line-and-space (L/S) pattern is formed. Then, the resist is subjected to post-exposure bake (PEB) at 90° C. for 90 seconds.

Next, the resist is subjected to paddle development for 90 seconds by a 0.21 N aqueous tetramethylammonium hydroxide (TMAH) solution using a developing apparatus shown in FIG. 2. In this process, a magnetic field is applied to the developing solution by the following procedure. (1) Development is carried out for 10 seconds with applying an upward magnetic field to the developing solution as shown in FIG. 3A and without rotating the wafer. (2) Development is carried out for 10 seconds with applying a downward magnetic field to the developing solution as shown in FIG. 3B and without rotating the wafer. (3) Development is carried out for 10 seconds with applying a magnetic field in horizontal direction to the developing solution as shown in FIG. 3C and with rotating the wafer at 30 rpm. In this step, the direction of a magnetic field applied to the developing solution is substantially changed by rotating the wafer. Steps (1) to (3) are repeated for 3 cycles. In this way, by applying a magnetic field to the developing solution in all directions, developing is progressed uniformly in the wafer surface.

Figure 4B:
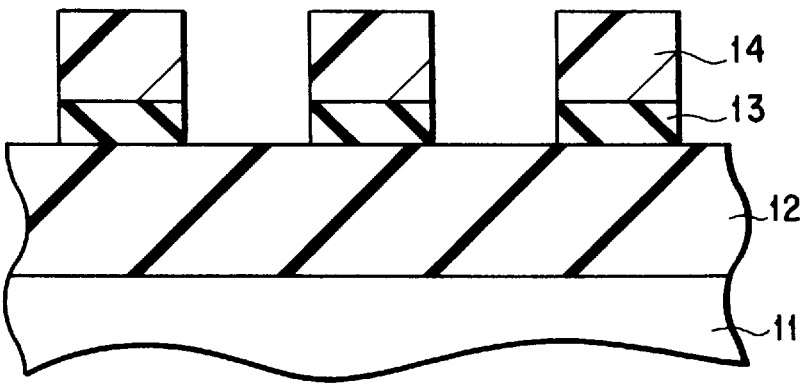

As shown in FIG. 4B, the exposed part of a resist 14 is removed to form a resist pattern, followed by rinsed with pure water. Then, the anti-reflective coating 13 is removed by reactive ion etching (RIE) using the resist pattern as a mask. Optionally, the resist pattern is subjected to drying bake at 130° C. for 60 seconds.

Figure 4C:
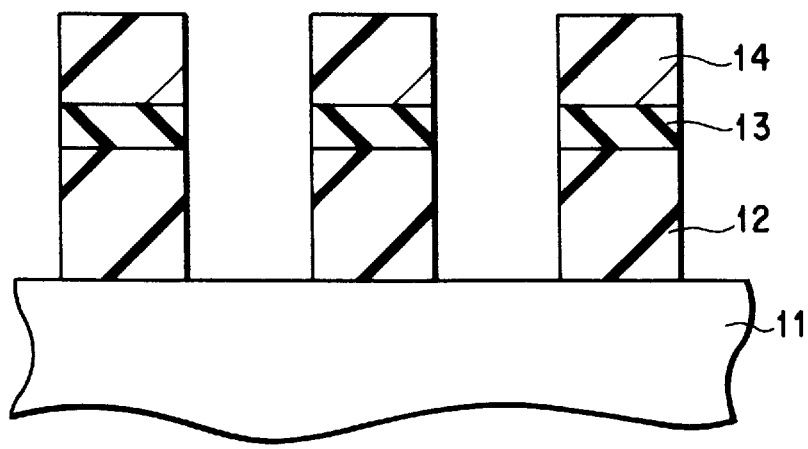

Then, as shown in FIG. 4C, the $SiO_2$ film 12 is etched by reactive ion etching (RIE) using the resist pattern as a mask.

When the method of the present invention is used, since uniformity of the developed resist profile in the semiconductor wafer surface is improved, uniformity of the pattern of the $SiO_2$ film 12 formed by etching using this resist profile as a mask is also improved.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A resist developing apparatus comprising:

a rotating axis for pivotally supporting a semiconductor wafer coated with a chemically amplified resist;

a nozzle for supplying an alkaline developing solution to the resist;

a first coil for applying a magnetic field in vertical direction to the alkaline developing solution on the resist; and, a second coil for applying a magnetic field in horizontal direction to the alkaline developing solution on the resist.

* * * * *